(12) United States Patent
Hu et al.

(10) Patent No.: US 10,269,859 B2
(45) Date of Patent: Apr. 23, 2019

(54) CAMERA MODULE

(71) Applicant: TDK TAIWAN CORP., Yangmei Taoyuan (TW)

(72) Inventors: Chao-Chang Hu, Yangmei Taoyuan (TW); Chen-Hsien Fan, Yangmei Taoyuan (TW)

(73) Assignee: TDK TAIWAN CORP., Yangmei Taoyuan (TW)

( * ) Notice: Subject to any disclaimer, the term of this patent is extended or adjusted under 35 U.S.C. 154(b) by 0 days.

(21) Appl. No.: 15/482,112

(22) Filed: Apr. 7, 2017

(65) Prior Publication Data

US 2017/0294476 A1    Oct. 12, 2017

Related U.S. Application Data (60) Provisional application No. 62/320,096, filed on Apr. 8, 2016, provisional application No. 62/356,874, filed on Jun. 30, 2016.

(30) Foreign Application Priority Data

Mar. 17, 2017    (TW) .............................. 106108889 A (51) Int. Cl.
| | | |
|---|---|---|
| *H01L 27/146* | (2006.01) | |
| *G03B 3/10* | (2006.01) | |
| *G02B 7/18* | (2006.01) | |
| *G03B 5/00* | (2006.01) | |
| *G03B 17/17* | (2006.01) | |
| *G02B 27/64* | (2006.01) | |
| *H04N 5/225* | (2006.01) | |
| *G02B 7/10* | (2006.01) | |

(Continued)

(52) U.S. Cl.
CPC ...... *H01L 27/14683* (2013.01); *G02B 7/1805* (2013.01); *G02B 27/1073* (2013.01); *G02B 27/646* (2013.01); *G03B 3/10* (2013.01); *G03B 5/00* (2013.01); *G03B 17/17* (2013.01); *G03B 17/26* (2013.01); *H01L 31/0203* (2013.01); *H04N 5/225* (2013.01); *H04N 5/2253* (2013.01); *H04N 5/2257* (2013.01); *G03B 2205/0046* (2013.01); *H04N 5/2254* (2013.01); *H04N 2201/0084* (2013.01)

(58) Field of Classification Search
CPC ............ H01L 27/14683; H04N 5/2257; H04N 5/2254; G03B 17/17
See application file for complete search history.

(56) References Cited

U.S. PATENT DOCUMENTS

| | | | | |
|---|---|---|---|---|
| 2009/0079824 A1* | 3/2009 | Winsor | ................. | G01S 3/7864 |
| | | | | 348/143 |
| 2015/0195459 A1* | 7/2015 | Yeo | ......................... | G03B 5/00 |
| | | | | 348/208.2 |

* cited by examiner

*Primary Examiner* — Ahmed A Berhan

(74) *Attorney, Agent, or Firm* — Muncy, Geissler, Olds & Lowe, P.C.

(57) ABSTRACT

A camera module is provided, including a prism base, a prism driving mechanism, a prism unit, a lens unit, and an image sensor. The lens unit is disposed on the lens driving mechanism. The prism base includes a metal member, at least one first wiring layer, and a first insulation layer disposed between the metal member and the first wiring layer. The prism driving mechanism is electrically connected to the first wiring layer. The prism unit is connected to the prism driving mechanism, and the prism driving mechanism can drive the prism unit to rotate relative to the prism base. The image sensor can catch the light reflected by the prism unit and passing through the lens unit.

7 Claims, 6 Drawing Sheets

(51) Int. Cl.
*G03B 17/26* (2006.01)
*H01L 31/0203* (2014.01)
*G02B 27/10* (2006.01)

CAMERA MODULE

CROSS REFERENCE TO RELATED APPLICATIONS

This application claims the benefit of U.S. Provisional Application No. 62/320,096, filed Apr. 8, 2016, U.S. Provisional Application No. 62/356,874, filed Jun. 30, 2016, and Taiwan Patent Application No. 106108889, filed Mar. 17, 2017, the entirety of which are incorporated by reference herein.

BACKGROUND OF THE INVENTION

Field of the Invention

The application relates in general to a camera module, and in particular, to a camera module having a prism assembly.

Description of the Related Art

As technology has advanced, a lot of electronic devices (for example, cameras and smartphones) have the functionality of taking photographs or recording video. These electronic devices have become more commonplace, and have been developed to be more convenient and thin. More and more choices are provided for users to choose from.

Generally, an electronic device having the functionality of taking photographs or recording video includes a driving module to drive one or more optical lens units to move along an optical axis, so as to facilitate auto-focus and auto-zoom controls. The light can pass through the optical lens units and form an image on an image sensor.

However, since electronic devices have become light and thin, it is hard to dispose a circuit board or lines therein. Therefore, how to address the aforementioned problem has become an important issue.

BRIEF SUMMARY OF INVENTION

To address the deficiencies of conventional products, an embodiment of the invention provides a camera module, including prism base, a prism driving mechanism, a prism unit, a lens unit, and an image sensor. The prism base includes a metal member, at least one first wiring layer, and a first insulation layer disposed between the metal member and the first wiring layer. The prism driving mechanism is electrically connected to the first wiring layer. The prism unit is connected to the prism driving mechanism, and the prism driving mechanism can drive the prism unit to rotate relative to the prism base. The image sensor can catch the light reflected by the prism unit and passing through the lens unit.

In some embodiments, the thickness of the metal member exceeds the total thickness of the first insulation layer and the first wiring layer.

In some embodiments, the thickness of the metal member is 0.10 mm-0.35 mm.

In some embodiments, the first wiring layer is formed on the first insulation layer by using a molded interconnect device.

In some embodiments, the first wiring layer is formed on the first insulation layer by coating.

In some embodiments, the metal member and the first wiring layer have the same coefficient of thermal expansion.

In some embodiments, the prism base further comprises at least one second wiring layer and a second insulation layer, wherein the second insulation layer is disposed between the second wiring layer and the metal member, and the metal member is disposed between the first insulation layer and the second insulation layer.

In some embodiments, the thickness of the metal member exceeds the total thickness of the second insulation layer and the second wiring layer.

Another embodiment of the invention provides a camera module, including a prism driving mechanism, a prism unit, an elastic member connected to the prism driving mechanism and the prism unit, a lens unit, and an image sensor. The elastic member includes a metal substrate, at least one first metal wire electrically connected to the prism driving mechanism, and a first insulation member disposed between the metal substrate and the first metal wire. The image sensor can catch the light reflected by the prism unit and passing through the lens unit.

In some embodiments, the thickness of the metal substrate exceeds the total thickness of the first insulation member and the first metal wire.

In some embodiments, the thickness of the metal substrate is 0.02 mm-0.35 mm.

In some embodiments, the first metal wire is formed on the first insulation member by using a molded interconnect device.

In some embodiments, the first metal wire is formed on the first insulation member by coating.

In some embodiments, the metal substrate and the first metal wire have the same coefficient of thermal expansion.

In some embodiments, the elastic member further comprises a plurality of first metal wires formed on the first insulation member, wherein the first metal wires are electrically independent.

In some embodiments, the prism driving mechanism comprises a frame and a prism holder. The elastic member is connected to the frame and the prism holder, and comprises a first fixed portion connected to the frame, a second fixed portion connected to the prism holder, and a string portion connected to the first fixed portion and the second fixed portion. A plurality of electrically independent first metal wires are disposed on the string portion.

In some embodiments, the elastic member further comprises a second insulation member and at least one second metal wire, wherein the second insulation member is disposed between the second metal wire and the metal substrate, and the metal substrate is disposed between the first insulation member and the second insulation member.

In some embodiments, the elastic member further comprises a plurality of second metal wires formed on the second insulation member, wherein the second metal wires are electrically independent.

In some embodiments, the prism driving mechanism comprises a frame and a prism holder. The elastic member is connected to the frame and the prism holder, and comprises a first fixed portion connected to the frame, a second fixed portion connected to the prism holder, and a string portion connected to the first fixed portion and the second fixed portion. A plurality of electrically independent second metal wires are disposed on the string portion.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the camera module are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood by one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
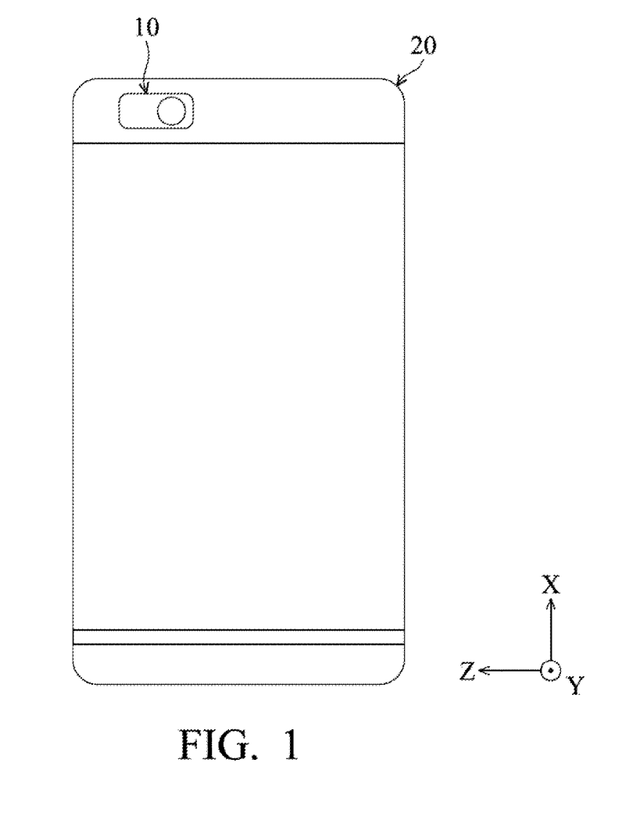
FIG. 1 is a schematic diagram of an electronic device according to an embodiment of the invention.

Referring to FIG. 1, in an embodiment of the invention, the camera module 10 can be disposed in an electronic device 20 and used to take photographs or record video. The electronic device 20 can be a smartphone or a digital camera, for example. When taking photographs or recording video, the camera module 10 can receive the light and form an image, wherein the image can be transmitted to a processor (not shown) in the electronic device 20, where post-processing of the image can be performed.

Figure 2:
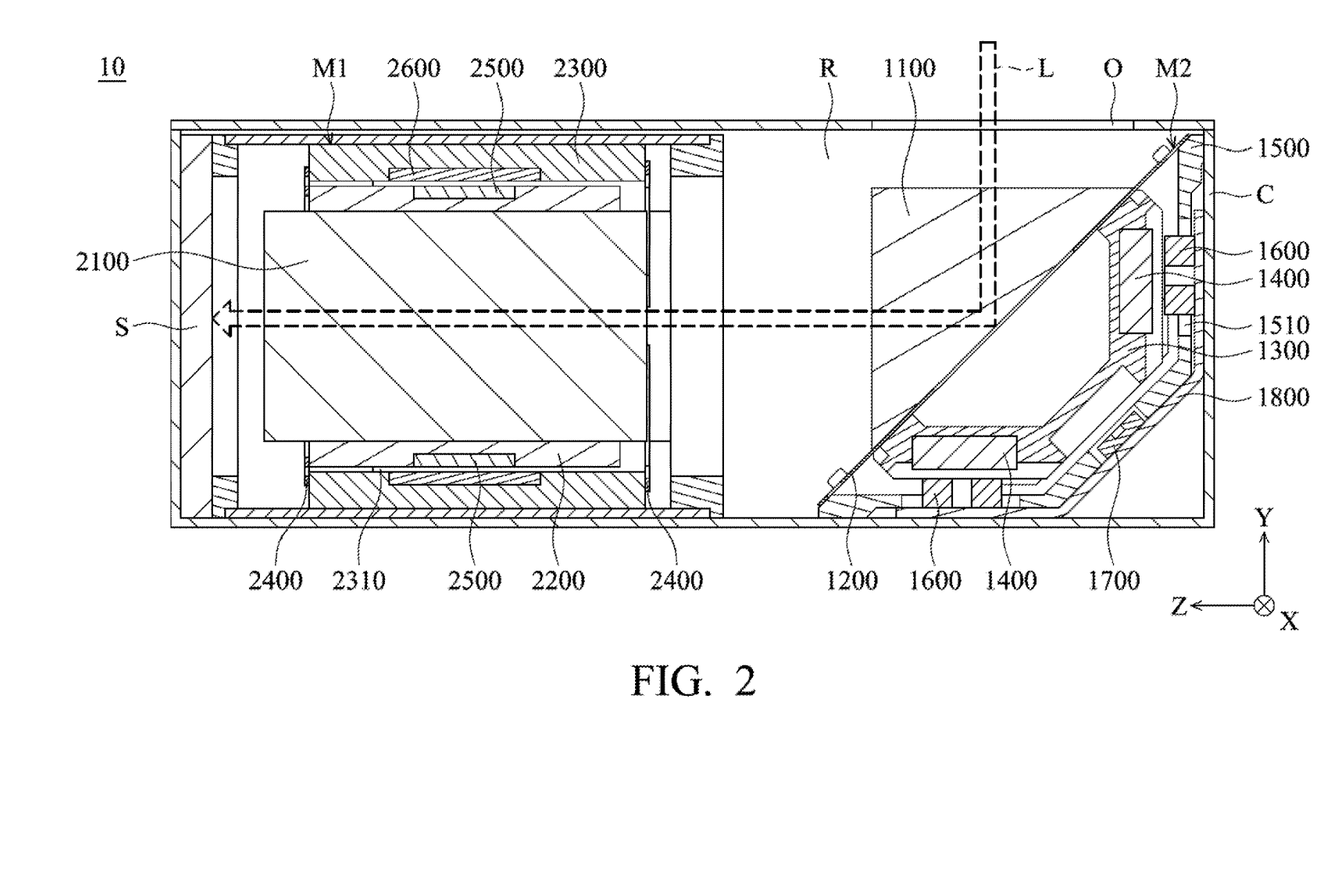
FIG. 2 is a schematic diagram of an camera module according to an embodiment of the invention.

As shown in FIG. 2, the camera module 10 comprises a housing C, a lens assembly M1, a prism assembly M2, and an image sensor S. The housing C has an accommodating space R and an opening O communicating with the accommodating space R, wherein the opening is formed on the wall of the housing C. The lens assembly M1, the prism assembly M2 and the image sensor S are disposed in the accommodating space R. The lens assembly M1 is disposed between the prism assembly M2 and the image sensor S, and the opening O is adjacent to the prism assembly M2.

When a light L passes through the opening O along the direction of Y-axis and enters the accommodating space R of the camera module 10, the prism assembly M2 can reflect the light L, and the reflected light L passes through the lens assembly M2 along the direction of Z-axis and reaches the image sensor S. In particular, the image sensor S can catch the light reflected by a prism unit 1100 of the prism assembly M2 and passing through a lens unit 2100 of the lens assembly M1.

As shown in FIG. 2, the lens assembly M1 primarily comprises the lens unit 2100 and a lens driving mechanism, wherein the lens driving mechanism is used to drive the lens unit 2100 to move relative to the image sensor S. For example, the lens driving mechanism can comprise a lens holder 2200, a case 2300, two spring sheets 2400, at least one coil 2500, and at least one magnetic member 2600.

The lens unit 2100 is affixed in the lens holder 2200. Two spring sheets 2400 are connected to the lens holder 2200 and the case 2300, and respectively disposed on opposite sides of the lens holder 2200. Thus, the lens holder 2200 is movably hung in the hollow portion 2310 of the case 2300. The coil 2500 and the magnetic member 2600 are respectively disposed on the lens holder 2200 and the case 2300, and correspond to each other. When current flows through the coil 2500, electromagnetic induction is generated between the coil 2500 and the magnetic member 2600, and the lens holder 2200 and the lens unit 2100 disposed thereon can be driven to move relative to the image sensor S.

Figure 3:
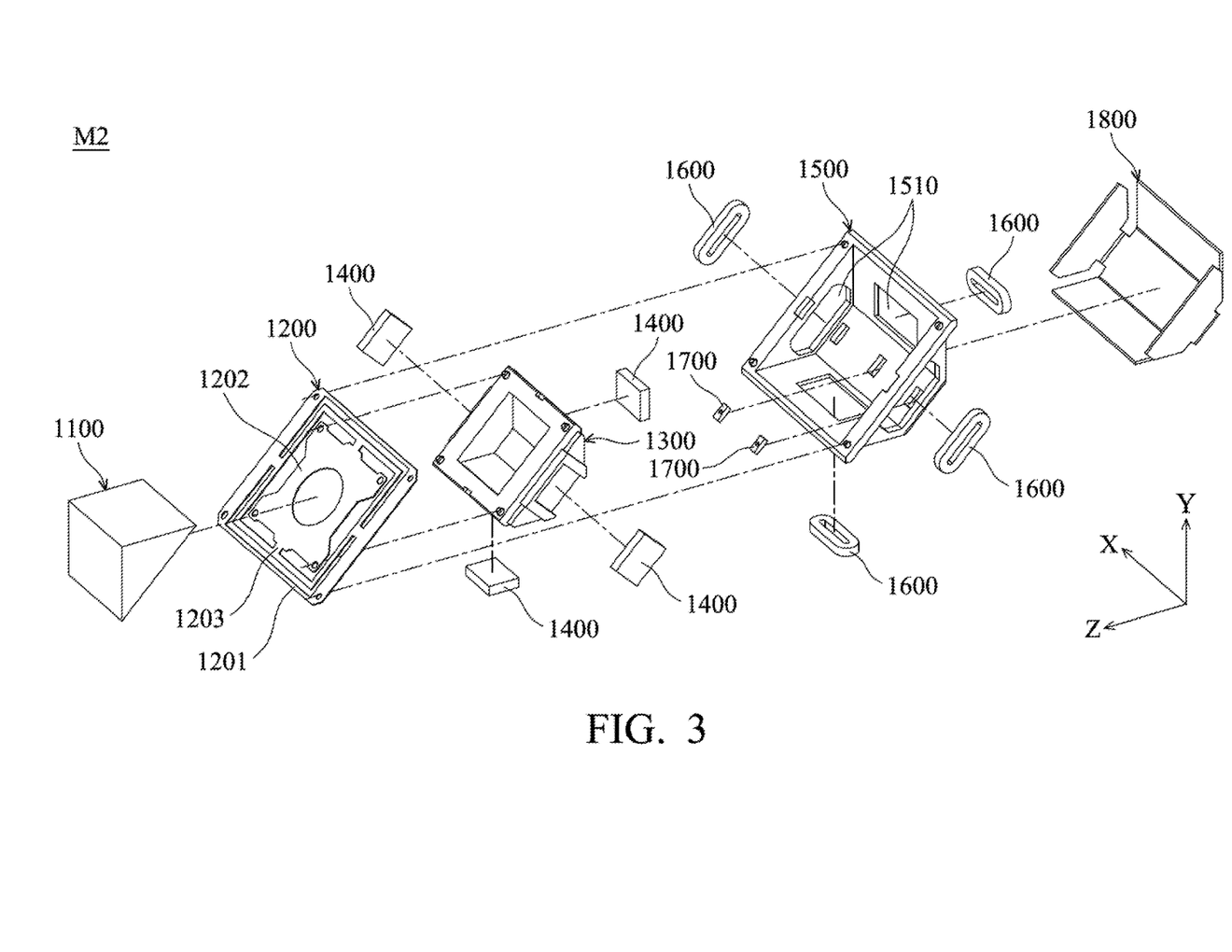
FIG. 3 is an exploded-view diagram of a prism assembly according to an embodiment of the invention.

FIG. 3 is an exploded-view diagram of a prism assembly M2. As shown in FIG. 3, in this embodiment, the prism assembly M2 primarily comprises the prism unit 1100 and a prism driving mechanism, wherein the prism driving mechanism comprises an elastic member 1200, a prism holder, a plurality of first electromagnetic driving assemblies 1400, a frame 1500, a plurality of second electromagnetic driving assemblies 1600, a plurality of position detectors 1700, and a prism base 1800.

Figure 4A:
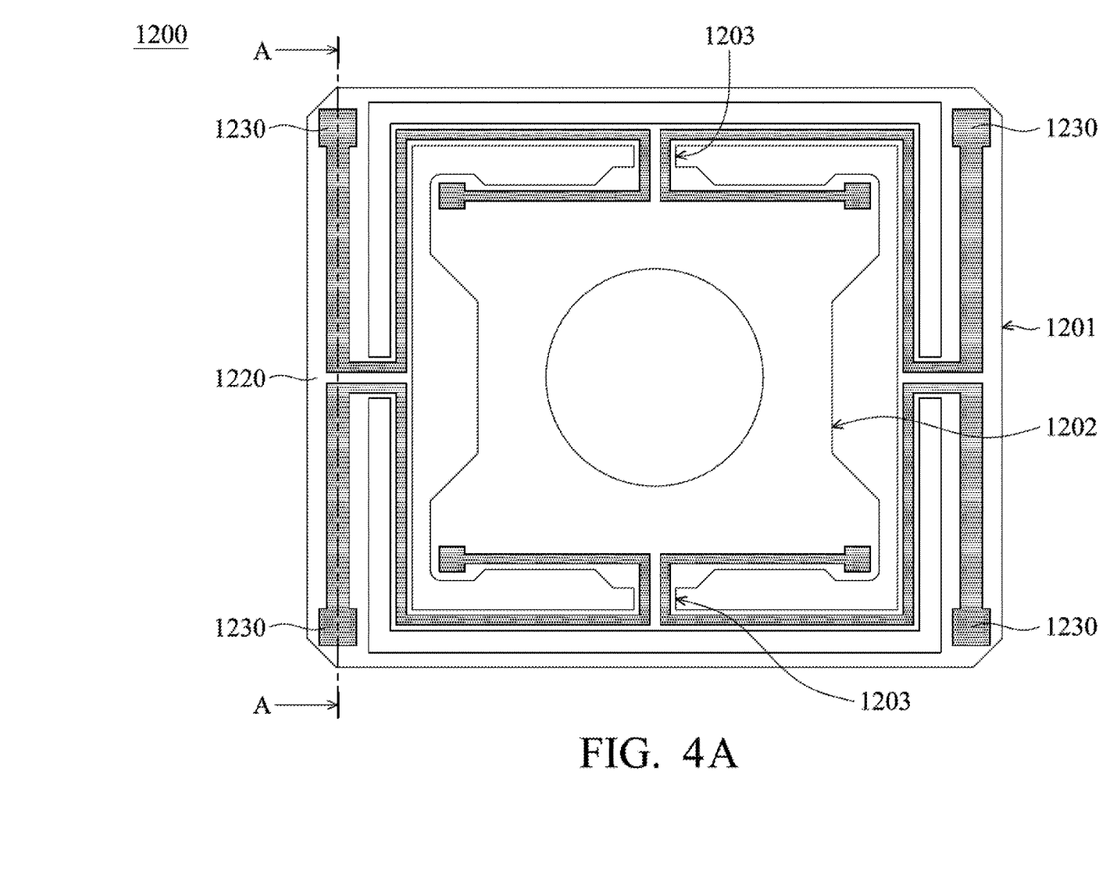
FIG. 4A is a schematic diagram of an elastic member according to an embodiment of the invention.

Referring to FIGS. 3 and 4A, the elastic member 1200 can comprise at least one first fixed portion 1201, at least one second fixed portion 1202, and at least one string portion 1203. The first fixed portion 1201 is affixed to the frame 1500, and the string portion 1203 is connected to the first fixed portion 1201 and the second fixed portion 1202. The prism unit 1100 and the prism holder 1300 are respectively affixed on opposite surfaces of the second fixed portion 1202. Namely, the prism unit 1100 and the prism holder 1300 are connected to each other via the elastic member 1200.

Figure 4B:
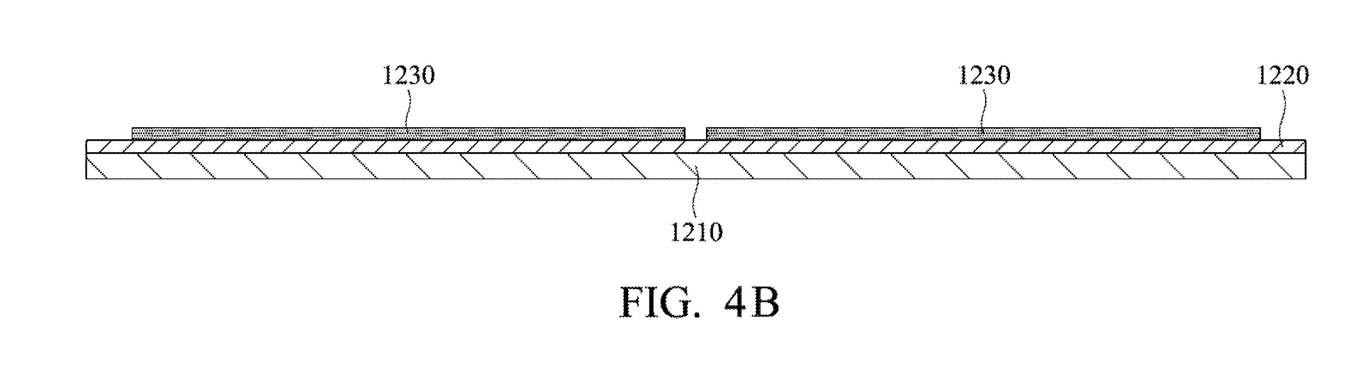
FIG. 4B is a cross-sectional view along line A-A in FIG. 4A.

FIG. 4B is a cross-sectional view along line A-A in FIG. 4A. As shown in FIGS. 4A and 4B, the elastic member 1200 can comprise a metal substrate 1210, a first insulation member 1220, and at least one first metal wire 1230, wherein the first insulation member 1220 is disposed between the metal substrate 1210 and the first metal wire 1230.

The thickness of the metal substrate 1210 exceeds the total thickness of the first insulation member 1220 and the first metal wire 1230. For example, the thickness of the metal substrate 1210 can be 0.02 mm-0.35 mm. The metal substrate 1210 and the first metal wire 1230 can have the same coefficient of thermal expansion, such that when the elastic member 1200 is heated, relative displacement is not generated between the metal substrate 1210 and the first metal wire 1230.

It should be noted that the elastic member 1200 can comprise a plurality of first metal wires 1230. These first metal wires 1230 are separate from each other and electrically independent. These first metal wires 1230 can be extended from the first fixed portion 1201 to the second fixed portion 1202 through the string portion 1203. The ends of each of the first metal wires 1230 disposed on the first fixed portion 1201 and the second fixed portion 1202 are used to electrically connect the other members (such as the second electromagnetic driving assemblies 1600).

The electrically independent first metal wires 1230 that are separate from each other can extend through the same string portion 1203. That is, a plurality of electrically independent first metal wires 1230 are disposed on each of the string portions 1203.

Figure 5:
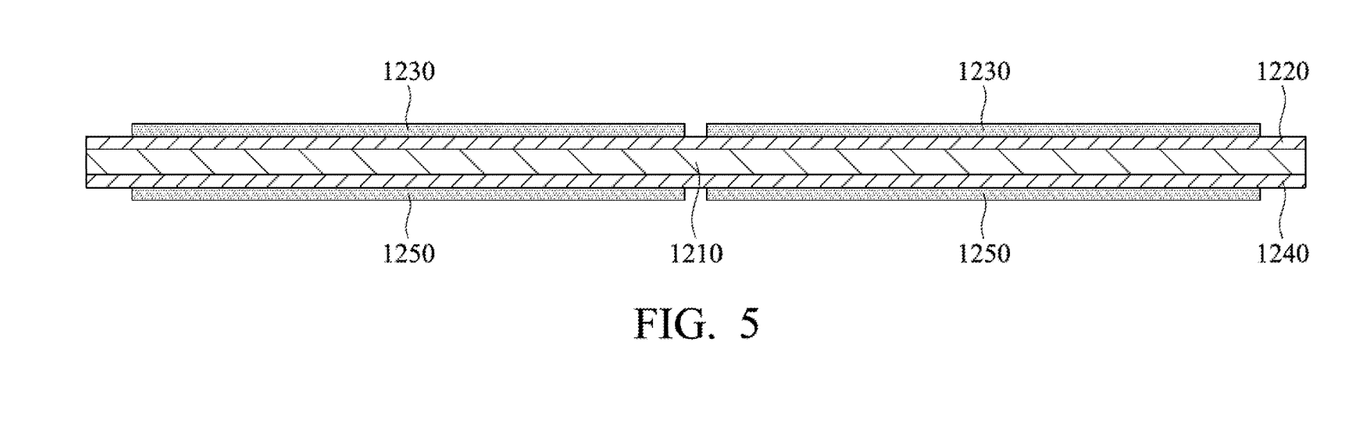
FIG. 5 is a schematic diagram of an elastic member according to another embodiment of the invention.

Referring to FIG. 5, in another embodiment, the elastic member 1200 further comprises a second insulation member 1240 and at least one second metal wire 1250. The metal substrate 1210 is disposed between the first insulation member 1220 and the second insulation member 1240, and the second insulation member 1240 is disposed between the metal substrate 1210 and the second metal wire 1250.

Similarly, the thickness of the metal substrate 1210 exceeds the total thickness of the second insulation member 1240 and the second metal wire 1250. The metal substrate 1210 and the second metal wire 1250 can have the same coefficient of thermal expansion, such that when the elastic member 1200 is heated, relative displacement is not generated between the metal substrate 1210 and the second metal wire 1250. When a plurality of second metal wires 1250 are disposed on the second insulation layer 1240, these second metal wires 1250 can be separate from each other and electrically independent, and the arrangement of the second metal wires 1250 can be similar to that of the first metal wires 1230 in FIG. 4A.

Since the electrically independent first metal wires 1230 and the electrically independent second metal wires 1250 can be arranged on the elastic member 1200, the elastic member 1200 does not need to be divided even when two or more conductive paths are needed. Thus, the integrated elastic member 1200 can be achieved, and assembly of the elastic member 1200 is facilitated. Furthermore, since the integrated elastic member 1200 can be achieved, the elastic force applied on the prism holder 1300 can be made uniform, and the rotation angle driven by the prism driving mechanism is more accurate. Moreover, the integrated elastic member 1200 has a larger fixed area relative to the divided elastic member. Therefore, the separation of the elastic member 1200 from the frame 1500, the prism unit 1100 or the prism holder 1300 due to collision of the camera module 10 can be avoided.

The first metal wires 1230 and the second metal wires 1250 can respectively be formed on the first insulation member 1220 and the second insulation member 1240 by using a molded interconnect device (MID), for example, by laser direct structuring (LDS), microscopic integrated processing technology (MIPTEC), laser induced metallization (LIM), laser restructuring print (LRP), an aerosol jet process, or a two-shot molding method. In some embodiments, the first metal wires 1230 and the second metal wires 1250 can respectively be formed on the first insulation member 1220 and the second insulation member 1240 by coating.

Referring to FIGS. 2 and 3, the first electromagnetic driving assemblies 1400 are affixed to the prism holder 1300 and surround the prism holder 1300. The second electromagnetic driving assemblies 1600 are affixed to the prism base 1800, pass through the holes 1510 of the frame 1500, and correspond to the first electromagnetic driving assemblies 1400.

The prism holder 1300 and the prism unit 1100 connected thereto can be driven by the electromagnetic induction between the first electromagnetic driving assemblies 1400 and the second electromagnetic driving assemblies 1600 to rotate relative to the frame 1500. For example, in this embodiment, the first electromagnetic driving assemblies 1400 can comprise at least one magnet, and the second electromagnetic driving assemblies 1600 can be a plurality of driving coils.

When a current flows through the driving coil (the second electromagnetic driving assemblies 1600), electromagnetic induction is generated between the driving coils and the magnets. Thus, the prism holder 1300 and the prism unit 1100 can be driven to rotate relative to the frame 1500 around the direction of the X-axis and/or the direction of the Y-axis, so as to finely adjust the position of the light L on the image sensor S.

In some embodiments, the first electromagnetic driving assemblies 1400 can be driving coils, and the second electromagnetic driving assemblies 1600 can be magnets.

Referring to FIGS. 2 and 3, the prism base 1800 is affixed to the housing C, and the frame 1500 and the position detectors 1700 are affixed to the prism base 1800. The position detectors 1700 can pass through the holes 1510 of the frame 1500, and detect the positions of the second electromagnetic driving assemblies 1400 to confirm the rotation angle of the prism unit 1100.

For example, the position detectors 1700 can be Hall sensors, magnetoresistance effect sensors (MR sensor), giant magnetoresistance effect sensors (GMR sensor), tunneling magnetoresistance effect sensors (TMR sensor), or fluxgate sensors.

Figures 6A, 6B:
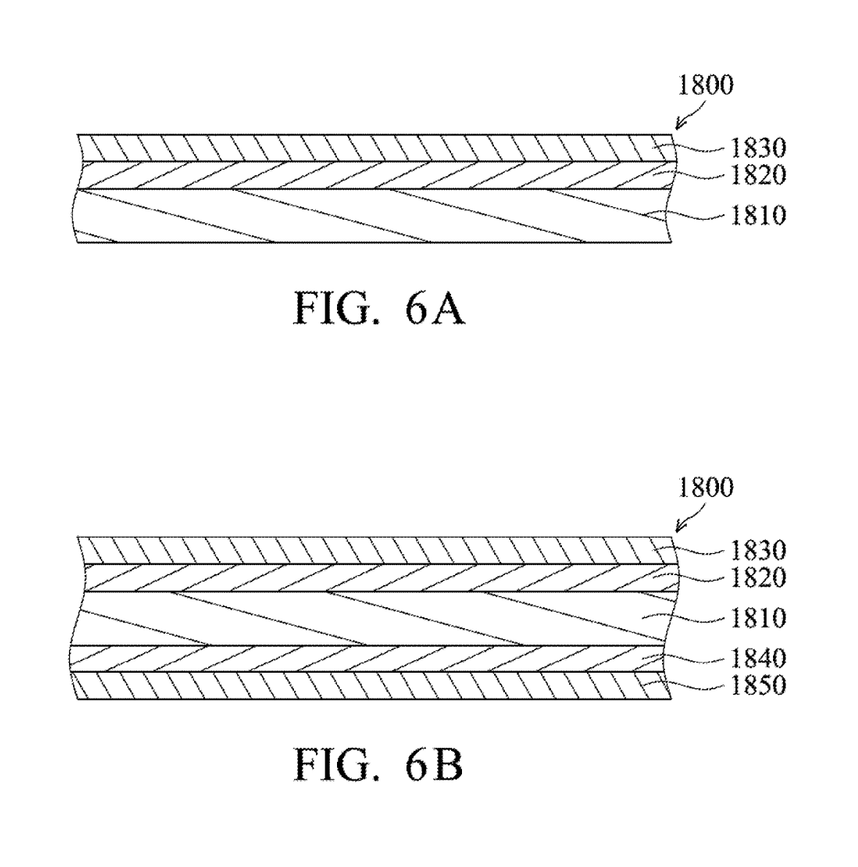
FIG. 6A is a cross-sectional view of a prism base according to an embodiment of the invention.
FIG. 6B is a cross-sectional view of a prism base according to another embodiment of the invention.

Referring to FIG. 6A, in this embodiment, the prism base 1800 has three layers, comprising a metal member 1810, a first insulation layer 1820, and at least one first wiring layer 1830, wherein the first insulation layer 1820 is disposed between the metal member 1810 and the first wiring layer 1830. For example, the first wiring layer 1830 can be electrically connected to the second electromagnetic driving assemblies 1600 and the position detectors 1700 in the prism driving mechanism for transmitting signals and power.

The thickness of the metal member 1810 exceeds the total thickness of the first insulation layer 1820 and the first wiring layer 1830. For example, the thickness of the metal member 1810 can be 0.10 mm-0.35 mm. The metal member 1810 and the first wiring layer 1830 can have the same coefficient of thermal expansion.

Referring to FIG. 6B, in another embodiment of the invention, the prism base 1800 has five layers, comprising a metal member 1810, a first insulation layer 1820, at least one first wiring layer 1830, a second insulation layer 1840, and at least one second wiring layer 1850. The first insulation layer 1820 is disposed between the metal member 1810 and the first wiring layer 1830, the metal member 1810 is disposed between the first insulation layer 1820 and the second insulation layer 1840, and the second insulation layer 1840 is disposed between the metal member 1810 and the second wiring layer 1850.

The thickness of the metal member 1810 exceeds the total thickness of the first insulation layer 1820 and the first wiring layer 1830, and exceeds the total thickness of the second insulation layer 1840 and the second wiring layer 1850. For example, the thickness of the metal member 1810 can be 0.10 mm-0.35 mm. The metal member 1810, the first wiring layer 1830, and the second wiring layer 1850 can have the same coefficient of thermal expansion.

Similarly, the first wiring layer 1830 and the second wiring layer 1850 can respectively be formed on the first insulation layer 1820 and the second insulation layer 1840 by using a molded interconnect device (MID), for example, by laser direct structuring (LDS), microscopic integrated processing technology (MIPTEC), laser induced metallization (LIM), laser restructuring print (LRP), an aerosol jet process, or a two-shot molding method. In some embodiments, the first wiring layer 1830 and the second wiring layer 1850 can respectively be formed on the first insulation layer 1820 and the second insulation layer 1840 by coating.

Since the prism base 1800 comprises the aforementioned structure, the prism assembly M2 does not need to dispose any further flexible printed circuit boards (FPC) or printed circuit boards (PCB), or embed the wires in the plastic bottom. Therefore, the manufacturing process can be simplified, the volume can be minimized, and the flatness and strength can be improved.

In summary, a camera module is provided, wherein a plurality of electrically independent metal wires can be arranged on the elastic member of a prism assembly, and the integration of the elastic member can be achieved. Furthermore, the wiring layer can be arranged on the metal member of the prism base, so that the camera can have sufficient hardness to resist collision.

Although some embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, compositions of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. Moreover, the scope of the appended claims should be accorded the broadest interpretation so as to encompass all such modifications and similar arrangements.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A camera module, comprising:
    a prism base, comprising:
        a metal member;
        at least one first wiring layer; and
        a first insulation layer, disposed between the metal member and the at least one first wiring layer;
    a prism driving mechanism, electrically connected to the at least one first wiring layer; and
    a prism unit, connected to the prism driving mechanism, wherein the prism driving mechanism can drive the prism unit to rotate relative to the prism base, and the thickness of the metal member exceeds the total thickness of the first insulation layer and the at least one first wiring layer.

2. The camera module as claimed in claim 1, wherein the thickness of the metal member is 0.10 mm-0.35 mm.

3. The camera module as claimed in claim 1, wherein the first wiring layer is formed on the first insulation layer by using a molded interconnect device.

4. The camera module as claimed in claim 1, wherein the at least one first wiring layer is formed on the first insulation layer by coating.

5. The camera module as claimed in claim 1, wherein the metal member and the at least one first wiring layer have the same coefficient of thermal expansion.

6. The camera module as claimed in claim 1, wherein the prism base further comprises:
    at least one second wiring layer; and
    a second insulation layer, wherein the second insulation layer is disposed between the second wiring layer and the metal member, and the metal member is disposed between the first insulation layer and the second insulation layer.

7. The camera module as claimed in claim 6, wherein the thickness of the metal member exceeds the total thickness of the second insulation layer and the second wiring layer.

* * * * *